United States Patent [19]
Girard

[11] Patent Number: 6,147,419
[45] Date of Patent: Nov. 14, 2000

[54] OUTPUT-MOTOR ASSEMBLY

[75] Inventor: Michel Girard, Corcelles-les-Citeaux, France

[73] Assignee: Schneider Electric SA, Boulogne Billancourt, France

[21] Appl. No.: 09/259,320

[22] Filed: Mar. 2, 1999

[30] Foreign Application Priority Data

Mar. 27, 1998 [FR] France ................................. 98 03944

[51] Int. Cl.$^7$ ...................................................... H02B 1/26
[52] U.S. Cl. ...................... 307/116; 361/600; 361/627; 200/307; 307/147
[58] Field of Search ..................................... 307/116, 147; 361/600, 601, 622, 625, 631, 632, 634, 627; 200/307

[56] References Cited

U.S. PATENT DOCUMENTS

| 5,184,278 | 2/1993 | Jordan et al. . | |
|---|---|---|---|
| 5,870,277 | 2/1999 | Girard et al. . | |
| 5,870,278 | 2/1999 | Girard et al. ........................... | 361/267 |

FOREIGN PATENT DOCUMENTS

| 0 425 393 | 5/1991 | European Pat. Off. . |
|---|---|---|
| 0 534 538 | 3/1993 | European Pat. Off. . |
| 295 07 456 | 8/1995 | Germany . |
| WO 97/43810 | 11/1997 | WIPO . |

*Primary Examiner*—Josie Ballato
*Assistant Examiner*—Rios Roberto
*Attorney, Agent, or Firm*—Oblon, Spivak, McClelland, Maier & Neustadt, P.C.

[57] ABSTRACT

Output-motor assembly comprising output elements assembled side by side on at least one socket (S), each element comprising switching devices (1, 3, 40) connected to corresponding connectors (50, 51, 52) on a printed circuit placed in the socket, the said connectors being connected to an input side connector (6) in the circuit fitted with groups of connection pins (D1–D8, C1–C8, R1–R8). The input side connector (6) comprises pins used for switching devices of socket (S) connected in a pin order corresponding to the order of the locations of elements on the socket, and pins useable for switching devices in at least one adjacent socket (S). The printed circuit (C) comprises an output side connector (7) with groups of connection pins identical to the groups on the input side connector (6), the useable pins on the input side connector (6) being connected to the same number of the first connection pins on the output side connector (7), in the same order.

4 Claims, 5 Drawing Sheets

OUTPUT-MOTOR ASSEMBLY

This invention relates to an output-motor assembly comprising output elements assembled side by side and fixed to at least one support socket, each element comprising electrical switching devices consisting of a circuit breaker, a contactor and a contactor coil control switching device, the socket containing a printed circuit provided with conducting tracks and a connector provided with groups of connection pins to which the switching devices are connected though conducting tracks, the pins being designed to be connected to one or several conductors in an instrumentation and control system for the complete assembly.

Each output element is used to supply power to a load such as a motor, or to start it or stop it depending on whether the contactor control conductors are switched on or off; the circuit breaker is adjacent to the contactor to break the contactor power supply lines when it perceives an operating anomaly such as an overvoltage in at least one of these lines, using appropriate monitoring devices.

The configuration of this type of output-motor assembly simplifies wiring operations and facilitates the connection of elements to an instrumentation and control system such as a PLC or a factory bus.

Since the number of output elements on a socket is limited, the user may wish to add other output elements; this is why several sockets sometimes need to be placed side by side to obtain the required number of elements.

In order to facilitate installation of sockets, and articularly so that it can be done more quickly, it must be possible to put them adjacent to each other, in any order while remaining sure that the socket input side connector correctly connects all elements in the various sockets with the instrumentation and control device.

This is why the output-motor assembly according to the invention is characterized in that the input side connector comprises pins used for the socket switching devices, and pins available for use for switching devices in at least one adjacent socket, in that the switching devices for the various socket output elements are connected to connection pins of the input side connector with a pin order corresponding to the order of the locations of the elements on the socket, and in that the printed circuit comprises an output side connector with groups of connection pins identical to the groups on the input side connector, the useable pins on the input side connector being connected to the first connection pins on the output side connector, through the same number of second conducting tracks and in the same order.

The invention will now be described in more detail with reference to the attached drawings, in which.

Figure 1:
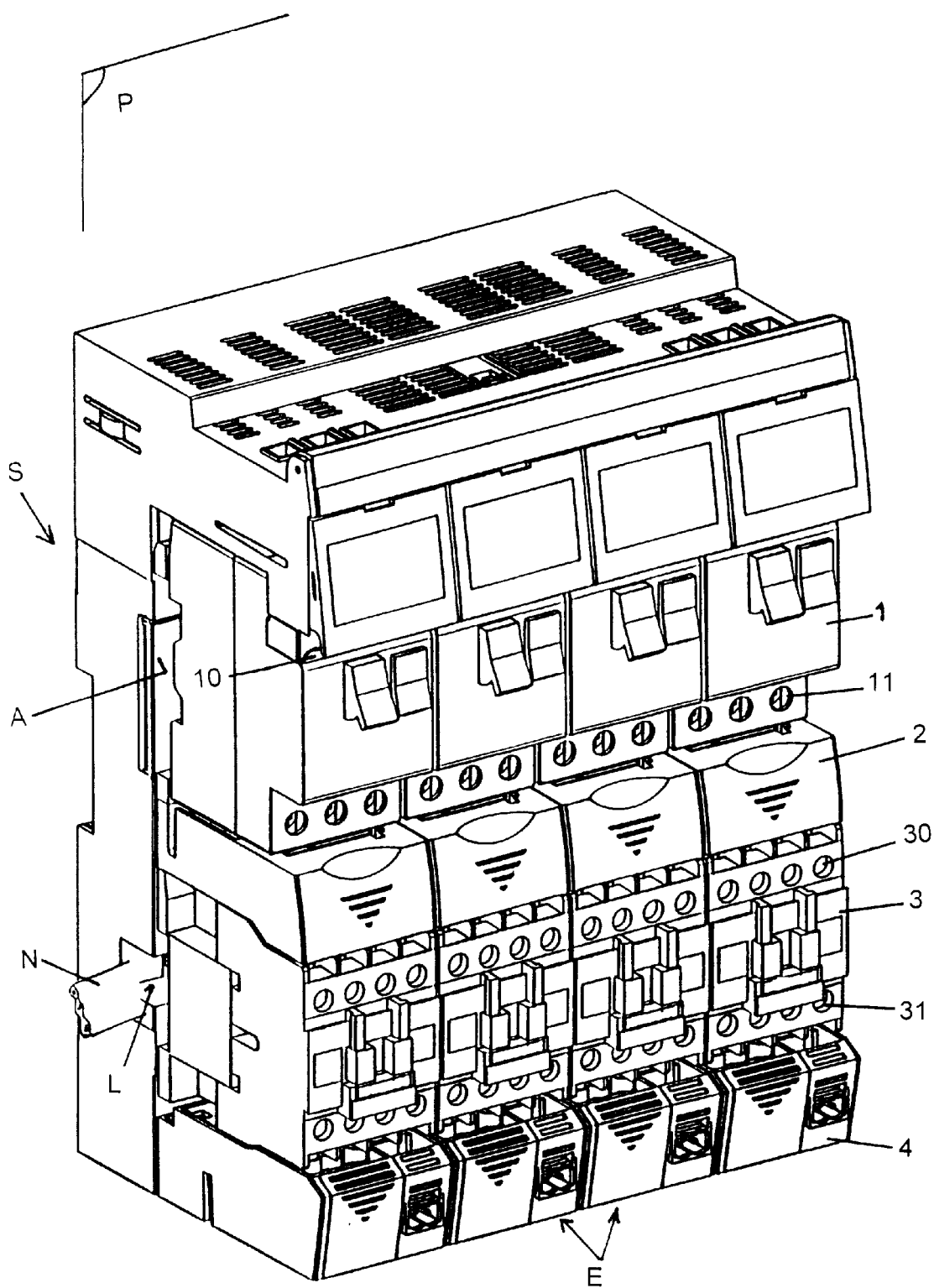
FIG. 1 shows a perspective view of an outputmotor assembly according to the invention.

The device illustrated in FIG. 1 consists of a socket S on which the output-motor elements E are fitted and connected. A socket may be configured to contain one, two or a maximum of four elements E. Several sockets can be assembled and connected together to form an output-motor assembly containing not more than eight elements.

Figure 2:
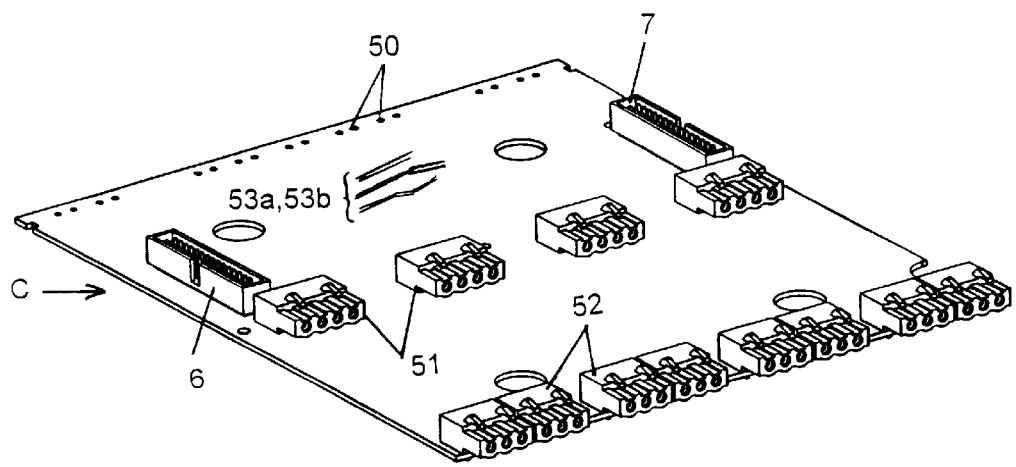
FIG. 2 shows a perspective view of the socket printed circuit.

The socket S comprises a shallow body provided with a front area A parallel to a plane P on which it can support elements E. It contains a printed circuit C (FIG. 2) which is parallel to P and provides control of interconnections for elements E and the external instrumentation and control connection between elements E and a bus or a system for example such as a programmable logic controller (not shown).

The back of socket S may be fixed to a support by any conventional sort of fasteners; click fit elements, screws, etc. Several sockets S can be mechanically connected to each other, preferably connected at the sides, by click fit means not shown in the figures.

An output element E comprises a circuit breaker 1, an intermediate block 2, a contactor 3 and a lower block 4.

Figure 3:
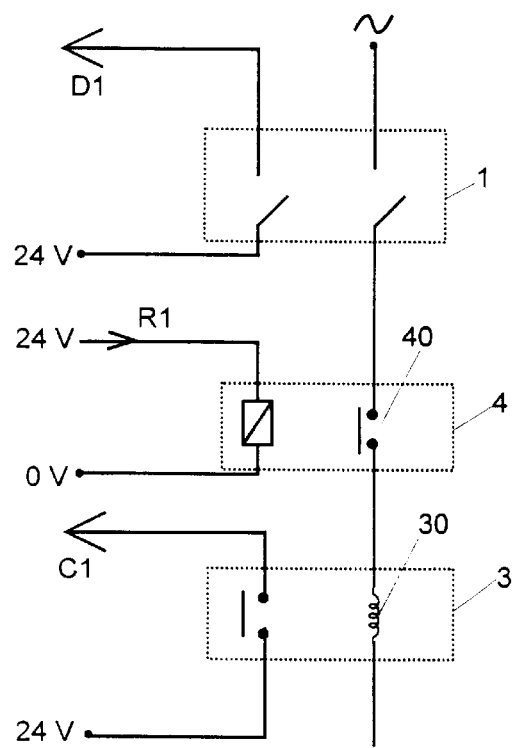
FIG. 3 illustrates the electrical circuit diagram for an output element.

Circuit breaker 1 comprises input side power terminals 10 designed to be fitted with conducting elements connected to power supply bars, and output side terminals 11 that will be connected to the contactor power terminals. The intermediate block 2 is used to electrically connect output terminals 11 of circuit breaker 1 to the input side power terminals 30 of contactor 3. Contactor 3 has output side power terminals 31 designed to be connected to a load (not shown) such as a motor. Finally, the lower block 4 comprises a switching device 40 that controls the contactor coil 30, such as a mechanical or static relay (FIG. 3).

The electrical switching devices 1, 3 and 40 are connected to the printed circuit C through connectors 50, 51 and 52 respectively. The printed circuit C comprises firstly an input side connector 6 connecting these devices with a programmable logic controller for their instrumentation and their control, and secondly an output side connector 7 making the interconnection with the connector 6 on the next socket. The terms input side and output side refer to the position of the connector with respect to the instrumentation and control system. Tracks 53*a* and 53*b* on the printed circuit make the required interconnections firstly between connectors 50–52 and the input side connector 6, and secondly between the input side connector 6 and the output side connector 7.

The socket S comprises a side recess L into which a flat cable N of instrumentation and control conductors will fit, and which will be connected to the input side connector 6 to make the connection to the bus or the programmable logic controller.

The type HE10 input side connector 6 is provided with thirty connection pins that are distributed into sixteen input pins that will provide instrumentation information to the PLC, eight output pins into which PLC control orders will be input, the remaining pins being used for the 24 Volt power supply to electrical switching devices.

The sixteen input pins are separated into two groups of eight inputs, namely eight inputs D1–D8 that correspond to the open or closed state of the eight potential circuit breakers of several associated output-motor assemblies, and eight other inputs C1–C8 corresponding to the open or closed state of the eight potential contactors coupled to circuit breakers. The group of eight output pins of R1–R8 corresponds to the open or closed state of the eight potential relays controlling the power supply to the eight coils associated with each of the eight contactors.

The conducting tracks 53*a* on the printed circuit are connected firstly to connectors 50, 51 and 52 of devices 1, 3 and 40 forming each element E, and secondly are connected in numeric order corresponding to the order of the locations of elements on the socket, to the first and subsequent input pins D1, C1, and to the first and subsequent output pins R1 on the input side connector.

Depending on the capacity of socket S, in other words the number of output elements E that it can contain, a corresponding number of pins on its input side connector will be used. Thus, for a socket with four elements, a maximum of only four pins D1–D4, four pins C1–C4 and four pins R1–R4 will be used. The other input and output pins, referred to as "useable pins" throughout the rest of this description, are managed in a manner which is described below.

The output side connector 7 is also of the HE10 type and has groups of connection pins identical to the groups on the input side connector. The useable input and output connection pins on the input side connector 6 are connected through second conducting tracks 53b (the same number of tracks in the same order) to the first input and output connection pins on the output side connector 7. This connection configuration means that several sockets can be used together in any order, the input side connector on the socket placed on the input side always addressing all elements of the various sockets to the PLC. The electrical connection of the two sockets is made by connecting the output side connector 7 on the first socket to the input side connector on the next socket in the same numerical order as the pins.

Figure 4:
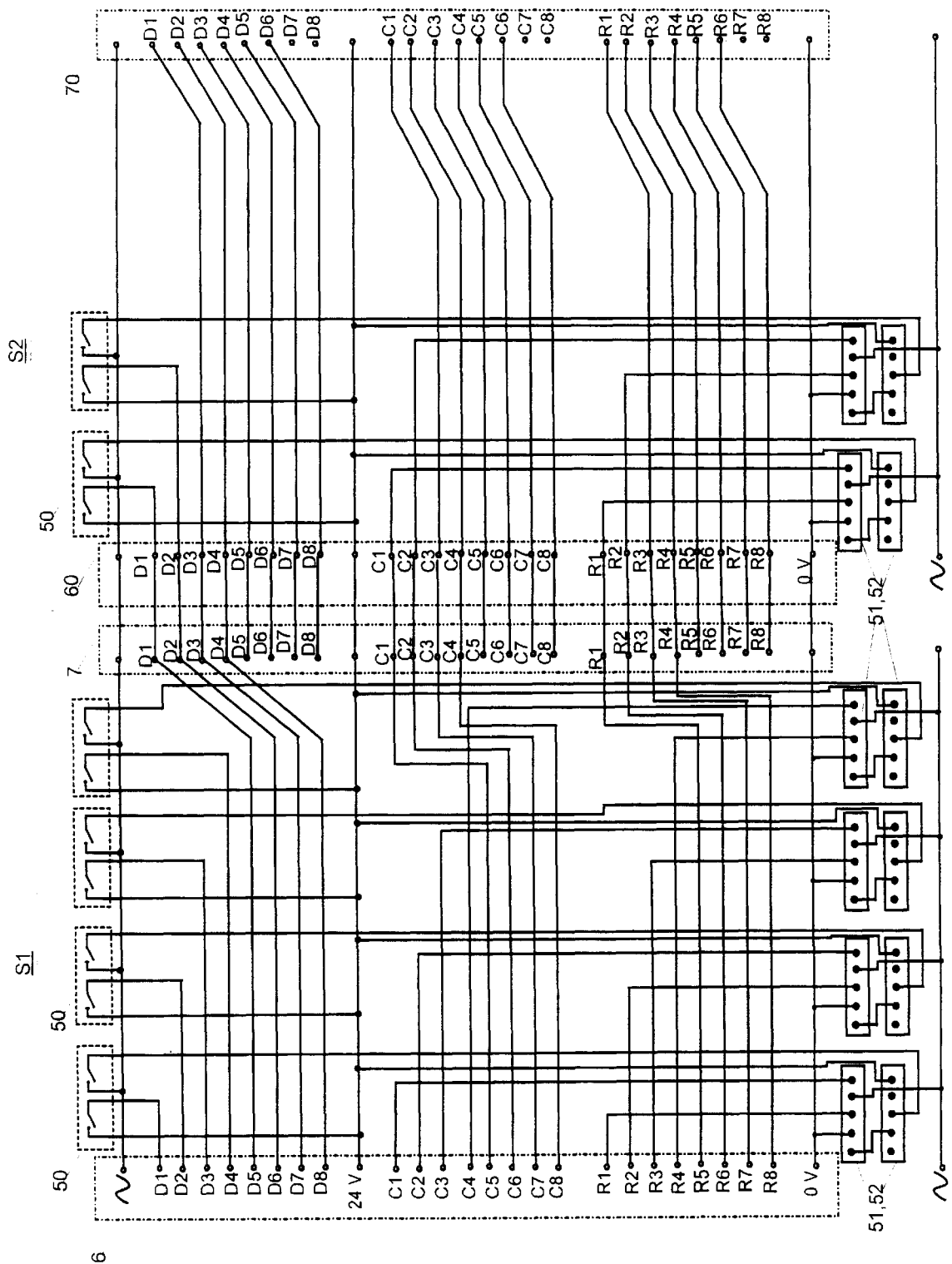
FIGS. 4 and 5 are circuit diagrams showing the electrical connection between several sockets, according to two different examples.

The example in FIG. 4 shows a combination of a socket S1 provided with four elements and a socket S2 provided with two elements, the socket S1 being placed on the input side of socket S2.

The devices in each of the four elements of socket S1 are connected to the first pins D1–D4, C1–C4 and R1–R4 R4 respectively on the input connector 6. Useable pins D5–D8, C5–C8 and R5–R8 on the input side connector are connected to the first pins D1–D4, C1–C4 and R1–R4 on the output side connector 7.

The devices on each of the two elements of socket S2 are connected to the first pins D1–D2, C1–C2 and R1–R2 R2 respectively, on the input side connector 60. Useable pins D3–D8, C3–C8 and R3–R8 on the input side connector 60 are connected to the first pins D1–D6, C1–C6 and R1–R6 on the output side connector 70.

The conductor connecting the input side connector 60 of socket S2 to the output side connector 7 of socket S1 connect pins with the same numbers together.

Thus, pins D1–D2, C1–C2 and R1–R2 on the input side connector 60 of socket S2 are connected to useable terminals D5–D6, C5–C6 and R5–R6 on the input side connector 6 of socket S1, itself connected to the PLC.

If the user had chosen to place socket S2 on the input side of socket S1, the input side connector 60 of socket S2 making the link with the PLC would have its connection pins D1–D2, C1–C2 and R1–R2 connected to the switching devices of the two elements in its socket, and pins D3–D6, C3–C6 and R3–R6 would be connected to the switching devices in the four elements of the output side socket S1.

Figure 5:
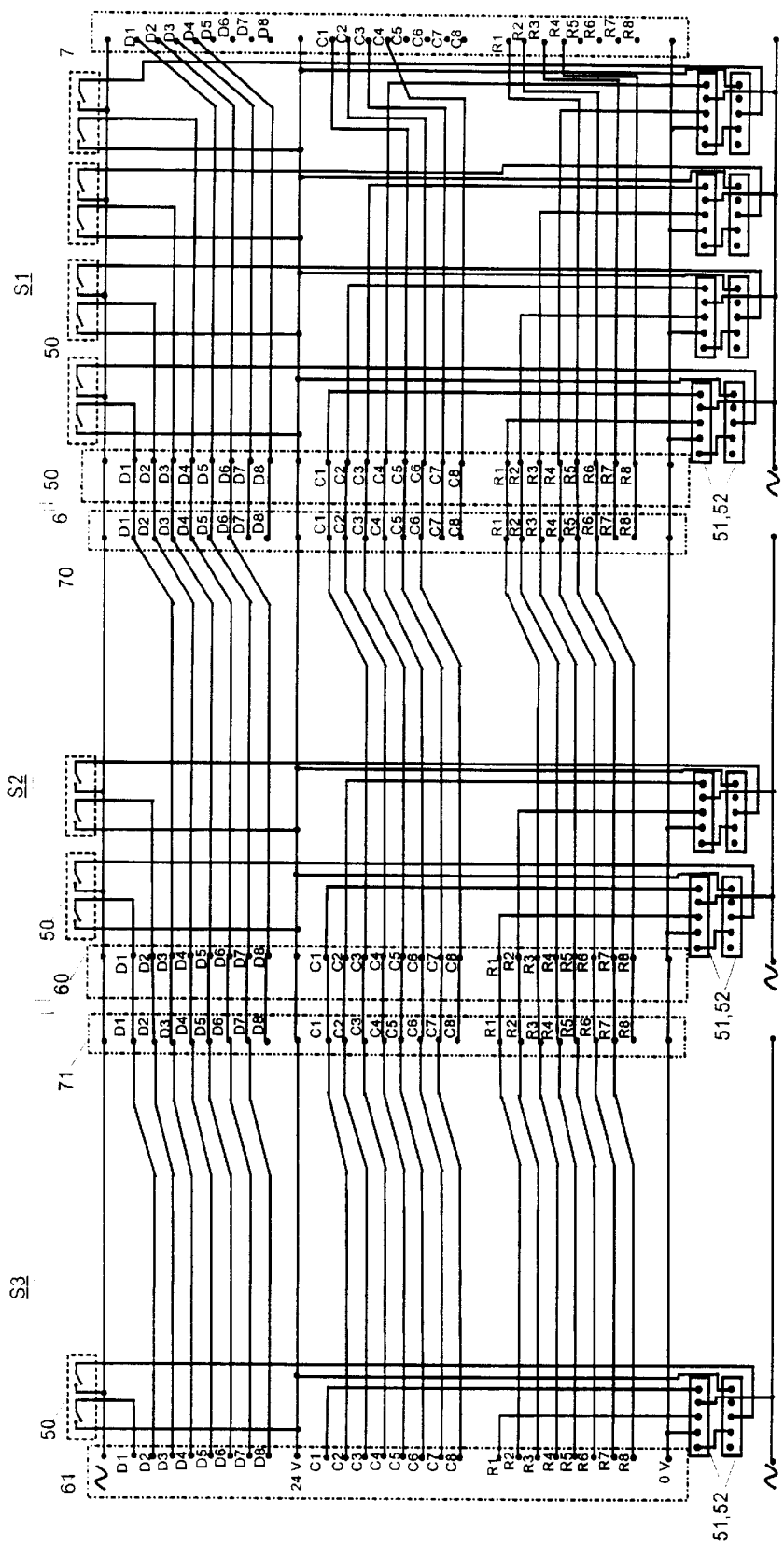

Consider another example shown in FIG. 5. This shows the input side to output side association of three sockets S3, S2, S1 which contain one, two and four output elements respectively.

The switching devices for the element of socket S3 are connected to the first pins D1, C1 and R1 on the input side connector 61. Useable pins D2–D8, C2–C8 and R2–R8 on the input side connector are connected to the first pins D1–D7, C1–C7 and R1–R7 on the output side connector 71. The input side connector 61 forms the connector providing the link with the PLC.

The switching devices on each of the two elements of socket S2 are connected to the first pins D1–D2, C1–C2 and R1–R2 respectively on the input side connector 60. Useable pins D3–D8, C3–C8 and R3–R8 on the input side connector 60 are connected to the first pins D1–D6, C1–C6 and R1–R6 on the output side connector 70.

The switching devices on each of the four elements of socket S1 are connected to the first pins D1–D4, C1–C4 and R1–R4 respectively on the input side connector 6. The useable pins D5–D8, C5–C8 and R5–R8 on the input side connector are connected to the first pins D1–D4, C1–C4 and R1–R4 on the output side connector 7.

A first conductor connecting the input side connector 6 of socket S1 to the output side connector 70 of socket S2 connects pins D1–D4, C1–C4 and R1–R4 on connector 6 to pins D3–D6, C3–C6 and P3–R6 on the input side connector 60 of socket S2.

A second conductor connecting the input side connector 60 of socket S2 to the output side connector 71 of socket S3 connects the used pins D1–D6, C1–C6 and P1–R6 on the input side connector 60 to pins D2–D7, C2C7 and R2–P7 on the input side connector 61 of socket S3.

Thus, the seven elements in the assembly are connected to connection pins D1–D7, C1–C7 and R1–R7 on the input side connector 61 of the assembly, the said connector being connected to the PLC.

Figure 6:
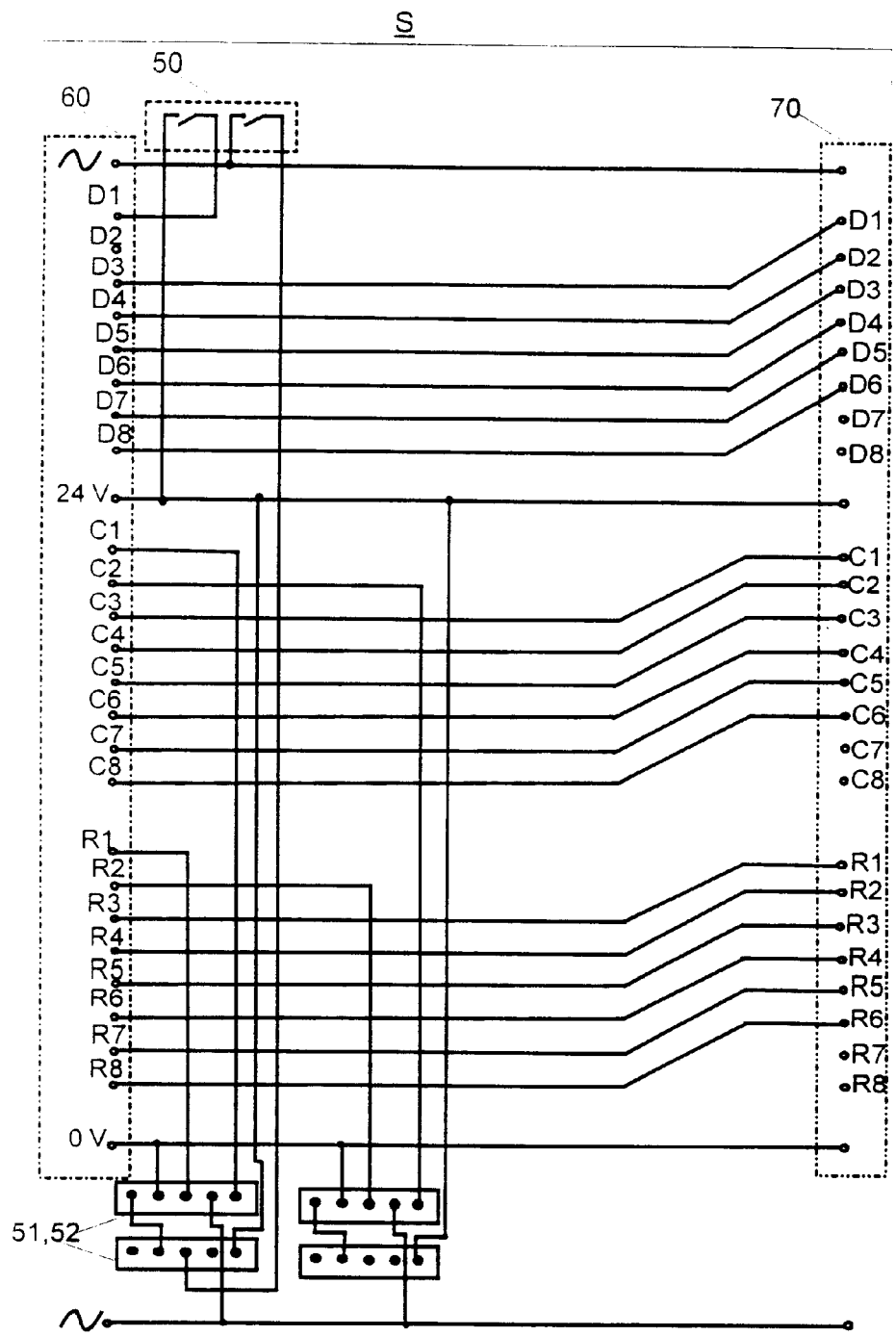
FIG. 6 shows a circuit diagram of a socket provided with a contactor-inverter switching device.

FIG. 6 illustrates a special case. This is a socket S comprising a single output-motor assembly composed of a circuit breaker, a relay and a contactor inverter switch. The contactor-inverter switch switches the motor on and off in either rotation direction. It actually consists of two contactors that are electrically coupled, one of the two being neutralized depending on the required direction of rotation. Since the power supply lines are only connected to one contactor, a single circuit breaker is sufficient to break the lines in the case of a problem.

Circuit breaker 1 is connected to the input connection terminal D1 of the input side connector. Due to the presence of two contactors for a single circuit breaker, it is essential not to make any connection on pin D2. Consequently, the only useable pins are pins D3–D8 which are connected to pins D1–D6 on the output side connector.

The two contactors 3 are connected to the input connection terminals C1 and C2, the useable pins C3–C8 being connected to pins C1–C6 on the output side connector.

The two contactor coil control relays 40 are connected to the output connection pins R1 and R2 of the input side connector, the useable pins R3–R8 being connected to pins R1–R6 on the output side connector.

What is claimed is:

1. Output-motor assembly comprising output elements assembled side by side on at least a first support socket, each element comprising switching devices composed of a circuit breaker, a contactor and a contactor coil control switching device, the first support socket containing a printed circuit provided with first and second conducting tracks, an output side connector having first connection pins, and an input side connector provided with groups of connection pins to which switching devices are connected through the first conducting tracks, the switching devices being designed to be connected to one or several conductors in an instrumentation and control system for the assembly, further comprising:

the input side connector having connection pins used for switching devices in the first support socket and connection pins useable for switching devices in at least one adjacent support socket, the switching devices for the various output elements assembled on the first support socket connected to the connection pins on the input side connector according to a pin order corresponding to the order of the elements on the first support socket, the printed circuit having an output side identical to the groups of connection pins on the input side connector, the input side connector having useable pins connected to the first connection pins on the output side connector through the same number of second conducting tracks (53*b*) in the same order.

2. Output-motor assembly according to claim 1, comprising several support sockets, wherein the input connector on an output side support socket is connected to the output side connector of an input side support socket such that their connection pins are connected to each other in the same numeric order.

3. Output-motor assembly according to claim 1, comprising several support sockets each comprising not more than four output elements, the output-motor assembly comprising not more than eight output elements.

4. Output-motor assembly according to claim 1, comprising a second support socket acting as a support to an output element including a circuit breaker, two electrically coupled contactors performing an inverter switch function and two switching devices associated with contactor coils, wherein the circuit breaker supported by said second support socket is connected to a first pin in a group on an input side connector of the second support socket, a second pin in this group not being connected, and the remaining pins in this group being useable for connection to other circuit breakers in at least one adjacent support socket.

* * * * *

UNITED STATES PATENT AND TRADEMARK OFFICE
CERTIFICATE OF CORRECTION

PATENT NO. : 6,147,419

DATED : November 14, 2000

INVENTOR(S): Michel GIRARD

It is certified that an error appears in the above-identified patent and that said Letters Patent is hereby corrected as shown below:

On the title page, item [22] the Filing Date is incorrect, item [22] should read as follows:

--[22]  Filed:  March 1, 1999--

Signed and Sealed this

First Day of May, 2001

Attest:

NICHOLAS P. GODICI

Attesting Officer    Acting Director of the United States Patent and Trademark Office